US010492317B1

(12) United States Patent
Ho et al.

(10) Patent No.: US 10,492,317 B1
(45) Date of Patent: Nov. 26, 2019

(54) EASILY ASSEMBLED AND DISASSEMBLED LATCHING STRUCTURE

(71) Applicant: Sercomm Corporation, Taipei (TW)

(72) Inventors: Li-Li Ho, Taipei (TW); Cheng-Chung Chang, Taipei (TW); Yi-Fei Yu, Taipei (TW)

(73) Assignee: SERCOMM CORPORATION, Taipei (TW)

( * ) Notice: Subject to any disclaimer, the term of this patent is extended or adjusted under 35 U.S.C. 154(b) by 0 days.

(21) Appl. No.: 16/383,800

(22) Filed: Apr. 15, 2019

(30) Foreign Application Priority Data

May 3, 2018 (CN) ..................... 2018 2 0651302 U

(51) Int. Cl.
*H05K 5/02* (2006.01)
(52) U.S. Cl.
CPC ......... *H05K 5/0221* (2013.01); *H05K 5/0256* (2013.01)
(58) Field of Classification Search
None
See application file for complete search history.

(56) References Cited

U.S. PATENT DOCUMENTS

| 6,375,283 | B1* | 4/2002 | Kitamura | ............. | H04B 1/3833 |
| | | | | | 292/81 |
| 8,480,186 | B2* | 7/2013 | Wang | ................... | H05K 5/0013 |
| | | | | | 312/223.1 |
| 8,701,279 | B2* | 4/2014 | Filson | ................... | G06F 1/1601 |
| | | | | | 29/830 |
| 9,332,659 | B2* | 5/2016 | Tan | ...................... | H05K 5/0008 |
| 9,545,019 | B2* | 1/2017 | Ishikura | ............... | H05K 5/0004 |
| 9,585,270 | B2* | 2/2017 | Yang | ..................... | H05K 5/0247 |
| 2004/0264113 | A1* | 12/2004 | Darr | ....................... | H05K 7/142 |
| | | | | | 361/601 |
| 2008/0105010 | A1* | 5/2008 | Chiang | ................. | E05B 13/004 |
| | | | | | 70/224 |
| 2009/0305754 | A1* | 12/2009 | Yuan | ................... | H04M 1/0237 |
| | | | | | 455/575.4 |
| 2011/0115349 | A1* | 5/2011 | Dernier | ................ | H05K 5/0013 |
| | | | | | 312/223.1 |
| 2011/0149488 | A1* | 6/2011 | Zhang | ................... | G06F 1/1624 |
| | | | | | 361/679.01 |
| 2015/0061475 | A1* | 3/2015 | Fairchild | ............. | H05K 5/0013 |
| | | | | | 312/223.1 |
| 2016/0120047 | A1* | 4/2016 | Chang | ................. | H05K 5/0221 |
| | | | | | 361/679.01 |

* cited by examiner

*Primary Examiner* — Xanthia C Cunningham
(74) *Attorney, Agent, or Firm* — McClure, Qualey & Rodack, LLP

(57) ABSTRACT

A latching structure includes a first plate, a second plate and a sliding plate disposed on a surface of the first plate and movable in a first direction. The first plate includes first arches each having an alignment hole in the first direction. The second plate includes second arches each having a latching hole in the first direction. The sliding plate includes pins corresponding to the latching holes. When the alignment hole accommodates the second arch and the sliding plate is located at a latching position, the pin is located in a corresponding latching hole to block separation of the first plate from the second plate in a second direction. When the sliding plate is located at a retracted position, the pin separates from the corresponding latching hole to allow separation of the first plate from the second plate in the second direction.

10 Claims, 11 Drawing Sheets

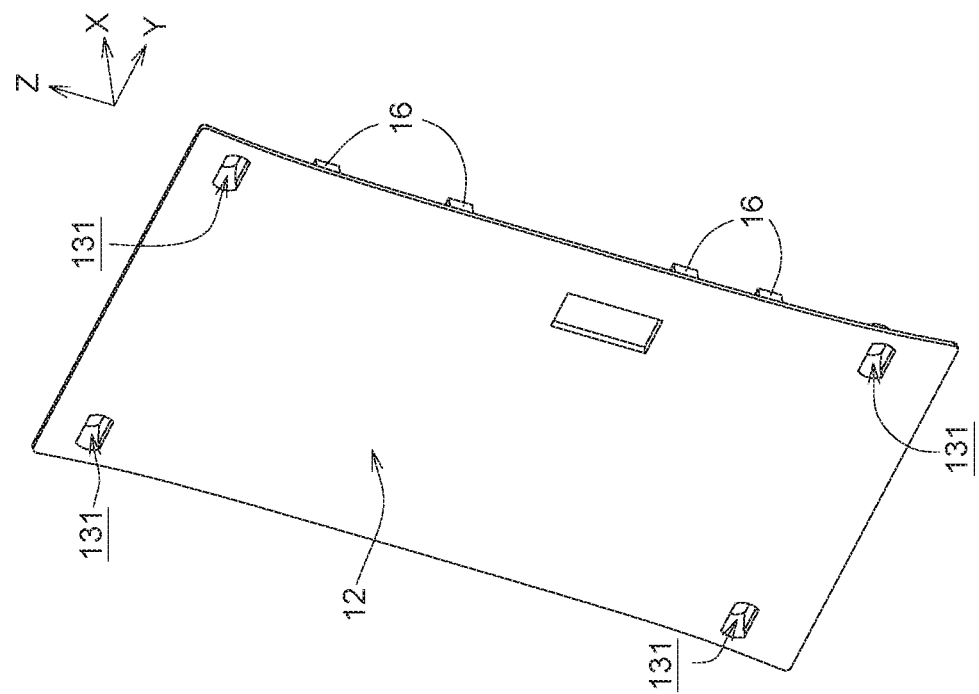
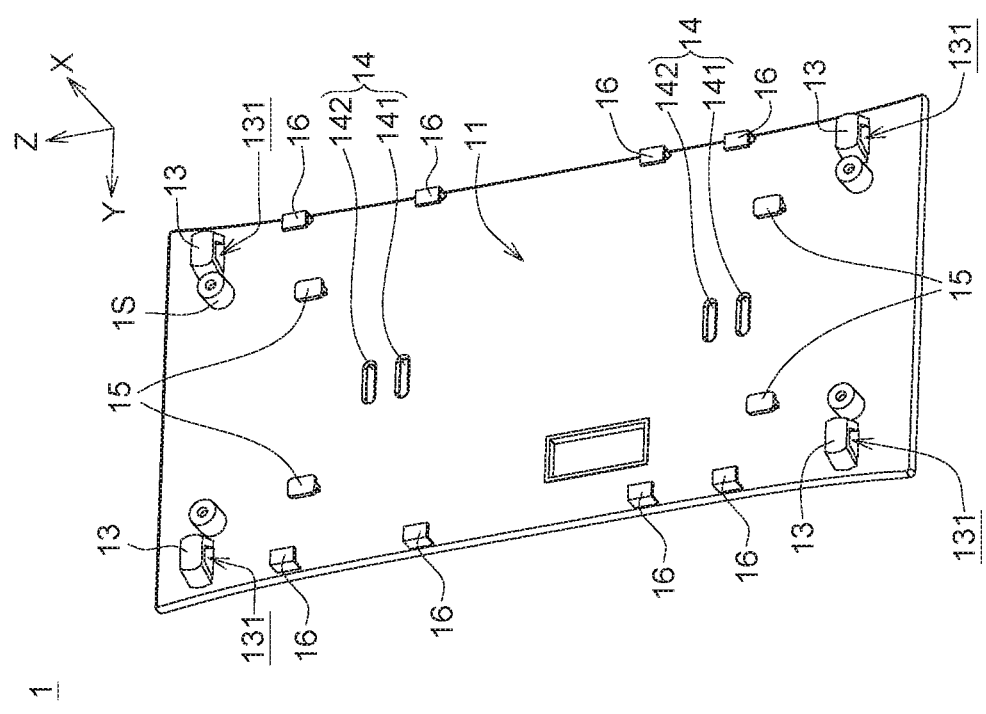
FIG. 2A
FIG. 2B

EASILY ASSEMBLED AND DISASSEMBLED LATCHING STRUCTURE

CROSS-REFERENCE TO RELATED APPLICATION

This application claims the benefit of People's Republic of China application Serial No. 201820651302.9, filed on May 3, 2018, the subject matter of which is incorporated herein by reference.

TECHNICAL FIELD

The invention relates in general to a latching structure, and more particularly to an easily assembled and disassembled latching structure.

BACKGROUND

To provide consumers with a variety of choices, there are some modular products available for consumers to purchase, and these modular products can be assembled with each other to meet the needs of consumers.

However, such modular products which are inconvenient to be assembled or disassembled may give users a bad experience.

SUMMARY

The present invention relates to an easily assembled and disassembled latching structure. The sliding plate is disposed on the first plate and movable between a latching position and a retracted position in a first axial direction on the first surface of the first plate. Thus, it is quite easy to assemble and disassemble the first plate and the second plate.

According to one aspect of the present invention, an easily assembled and disassembled latching structure is provided. The latching structure includes a first plate, a second plate and a sliding plate. The first plate includes a plurality of first arches recessed from a second surface of the first plate and projecting from a first surface of the first plate. The first arches each has an alignment hole passing underneath each of the first arches in a first axial direction. The first surface is opposite to the second surface. The second plate includes a plurality of second arches. Each of the second arches is adapted to be accommodated by a corresponding one of the alignment holes. Each of the second arches has a latching hole passing underneath each of the second arches in the first axial direction. The sliding plate includes a plurality of pins respectively corresponding to the latching holes. The sliding plate is disposed on the first surface of the first plate and movable between a latching position and a retracted position in the first axial direction. When each of the alignment holes accommodates a corresponding one of the second arches and the sliding plate is located at the latching position, the pins are each located in a corresponding one of the latching holes to block separation of the first plate from the second plate in a second axial direction perpendicular to the first axial direction. When the sliding plate is located at the retracted position, the pins each separates from the corresponding one of the latching holes to allow separation of the first plate from the second plate in the second axial direction.

According to the above, the present invention provides an easily assembled and disassembled latching structure. The first plate and the sliding plate disposed on the first plate, and the second plate may be respectively disposed on the two modular products, which can be assembled with each other, at the time of shipment, and the combination of the two modular products is very simple, convenient and reliable.

BRIEF DESCRIPTION OF THE DRAWINGS

FIG. 2A is a three-dimensional diagram of the first plate viewed from top angle according to one embodiment of the present invention.

FIG. 2B is a three-dimensional diagram of the first plate viewed from bottom angle according to one embodiment of the present invention.

Figure 1A:
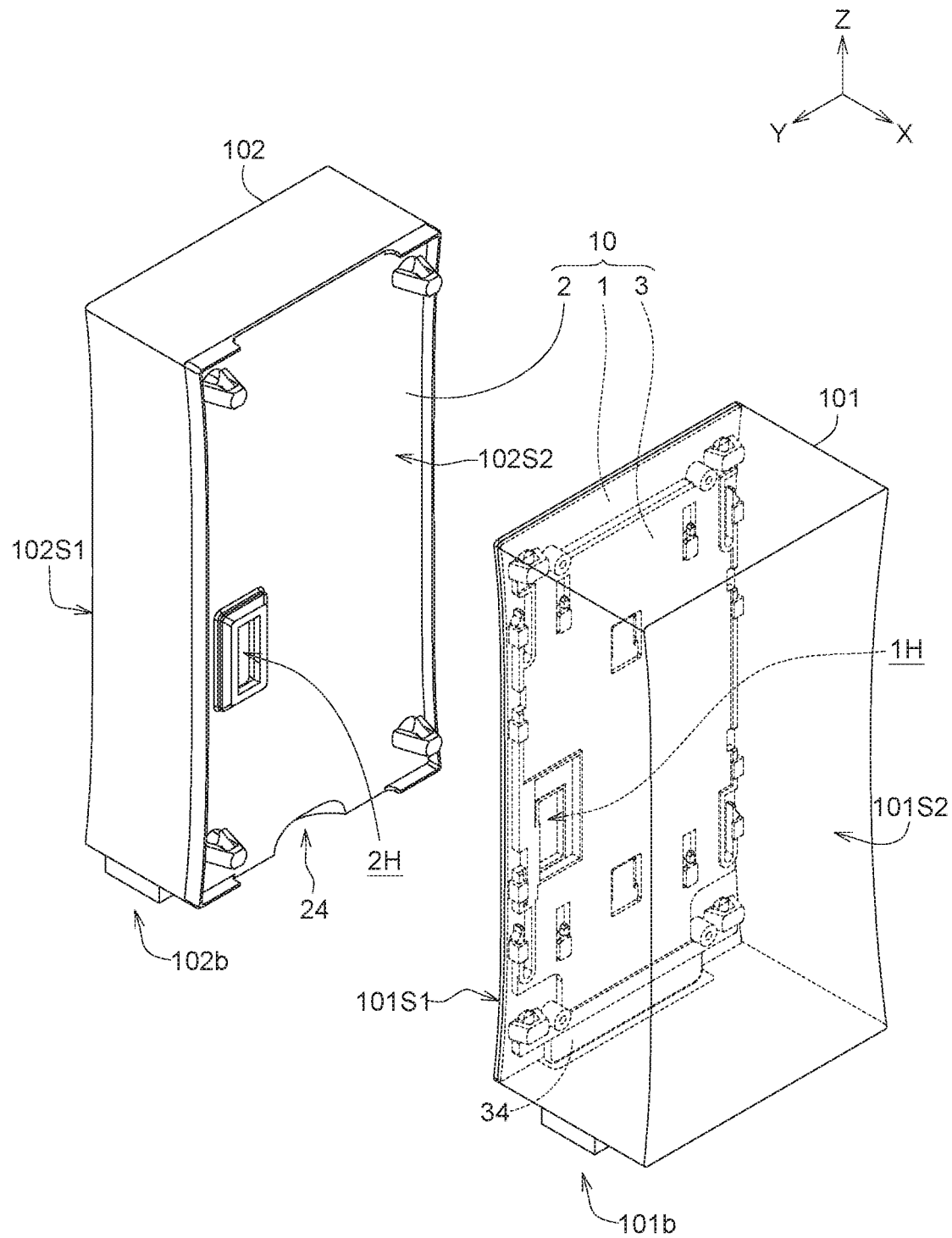
FIG. 1A is an exploded view showing an application of an easily assembled and disassembled latching structure according to one embodiment of the present invention.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Detailed descriptions of the present invention are disclosed below with a number of embodiments. Although the present invention does not illustrate all possible embodiments, other embodiments not disclosed in the present invention are still applicable. Moreover, the dimension scales used in the accompanying drawings are not based on actual proportion of the product. Therefore, the specification and drawings are for explaining and describing the embodiment only, not for limiting the scope of protection of the present invention. Furthermore, in the drawings of the embodiments, some elements are omitted so that technical features of the present invention can be clearly illustrated.

Designations common to the accompanying drawings and embodiments are used to indicate identical or similar elements.

Referring to FIG. 1A, an exploded view showing an application of an easily assembled and disassembled latching structure 10 according to one embodiment of the present invention is illustrated. The latching structure 10 includes a first plate 1, a second plate 2 and a sliding plate 3. The sliding plate 3 is assembled to the first plate 1. The latching structure 10 may be applied to the assembly of two modular products, wherein the two modular products may be provided with respective functions and applications. The latching structure 10 may also be applied to the assembly of one modular product and one modular cover.

For example, in one embodiment, the first plate 1 and the sliding plate 3 are disposed on a first communication device 101, and the second plate 2 is disposed on a second communication device 102. In this example, the first communication device 101 and the second communication device 102 may respectively be one of the communication devices, such as an Internet of Things communication device, a base station, a small cell, a Wi-Fi access hotspot, a router, and the like. The first plate 1 may be used as a side plate of the first communication device 101. For example, the first plate 1 may be disposed on a first side 101S1 of the first communication device 101, and the sliding plate 3 may be disposed on a surface of the first plate 1 facing the interior of the first communication device 101. The second plate 2 may be used as a side plate of the second communication device 102. For example, the second plate 2 may be disposed on a second side 102S2 of the second communication device 102.

Figure 1B:
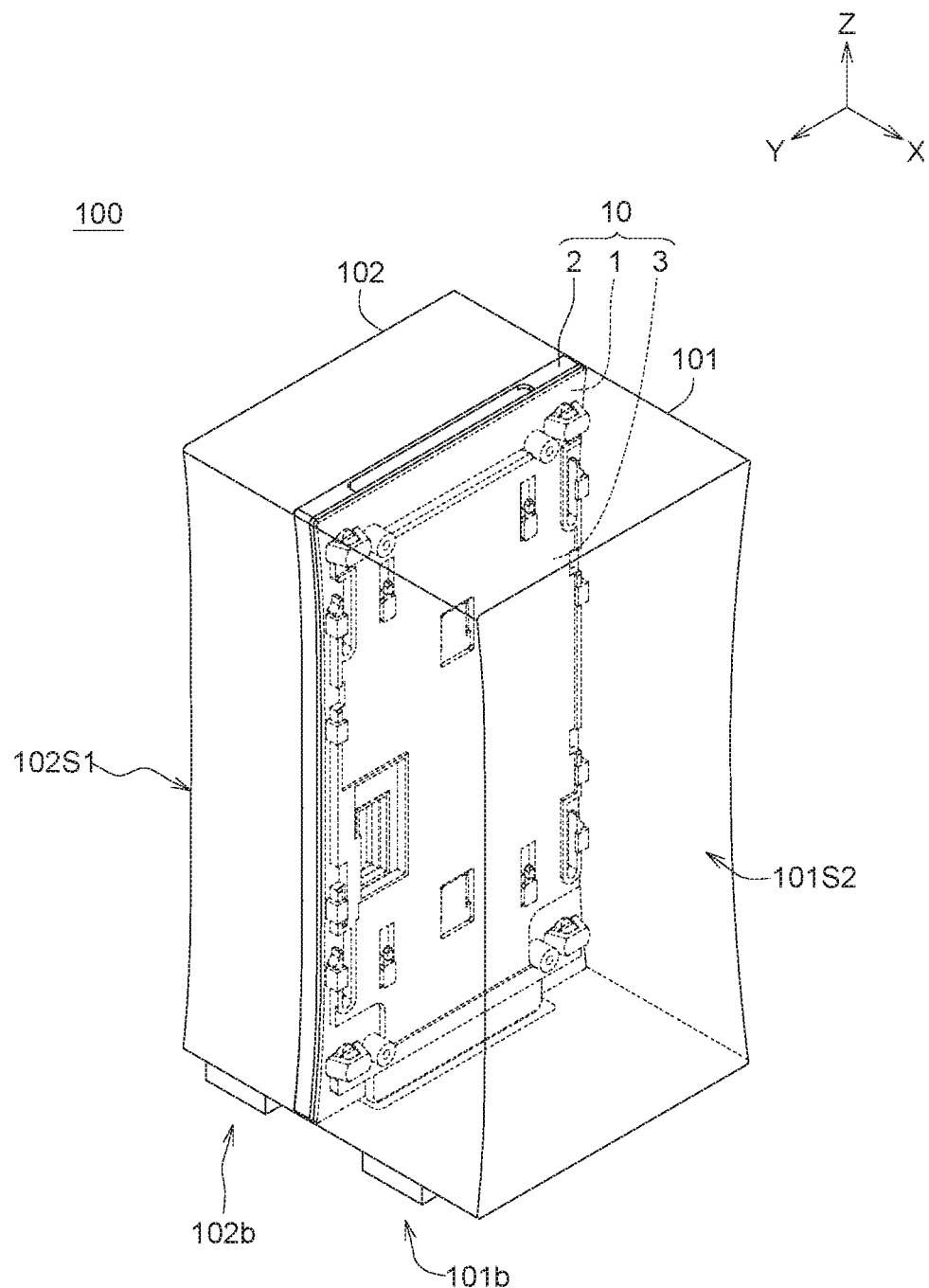
FIG. 1B is a three-dimensional diagram of the application according to FIG. 1A.

FIG. 1B is a three-dimensional diagram of the application according to FIG. 1A, Referring to FIG. 1A and FIG. 1B, the first communication device 101 and the second communication device 102 may be assembled together by facing the second side 102S2 of the second communication device 102 to the first side 101S1 of the first communication device 101. Here, both of the first plate 1 and the second plate 2 may have respective openings 1H and 2H to allow passage of the electrical connectors between the first communication device 101 and the second communication device 102. By the latching structure 10, the assembly/disassembly of the first communication device 101 and the second communication 102 may be more simple and convenient. In addition, the latching structure 10 may respectively be disposed on two modular products, which can be assembled with each other, at the time of shipment. Therefore, there is no need to have additional joining element to facilitate the combination of the two modular products.

Furthermore, the first communication device 101 may further be assembled to a third communication device (not depicted). In this condition, another second plate 2 may be disposed on the second side 101S2 of the first communication device 101, another first plate 1 and sliding plate 3 may be disposed on the first side of the third communication device in the same way, and the first communication device 101 and the third communication device are assembled together by facing the second side 101S2 of the first communication device 101 to the first side of the third communication device. Similarly, the second communication device 102 may also be assembled to a fourth communication device. In this condition, still another first plate 1 and sliding plate 3 may be disposed on the first side 102S1 of the second communication device 102, still another second plate 2 may be disposed on the second side of the fourth communication device in the same way, and the fourth communication device and the second communication device 102 are assembled together by facing the second side of the fourth communication device to the first side 102S1 of the second communication device 102. Thus, the user may be free to choose at least two modular products to combine together. For convenience of explanation, the first side of each device mentioned above refers to the side facing negative X axis in the drawing, and the second side refers to the side facing positive X axis in the drawing.

FIG. 2A and FIG. 2B are three-dimensional diagrams of the first plate 1 respectively viewed from two different angles according to one embodiment of the present invention. The first plate 1 includes the first surface 11 and the second surface 12 opposite to each other, wherein the first surface 11 faces the positive X axis, and the second surface 12 faces the negative X axis. The first plate 1 includes a plurality of first arches 13 projecting from the first surface 11 of the first plate 1 and recessed from the second surface 12 of the first plate 1. In some embodiment, the first arches 13 may be disposed on four corners of the first plate 1.

Each of the first arches 13 has an alignment hole 131. Referring to FIG. 2A, the alignment hole 131 passes beneath each first arch 13 in an axial direction parallel to Z axis. In addition, referring to FIG. 2B, the alignment hole 131 is further recessed from the second surface 12 of the first plate 1 in a direction towards the positive X axis, but does not pass through each first arch 13 in a direction towards the positive X axis.

Figure 3B:
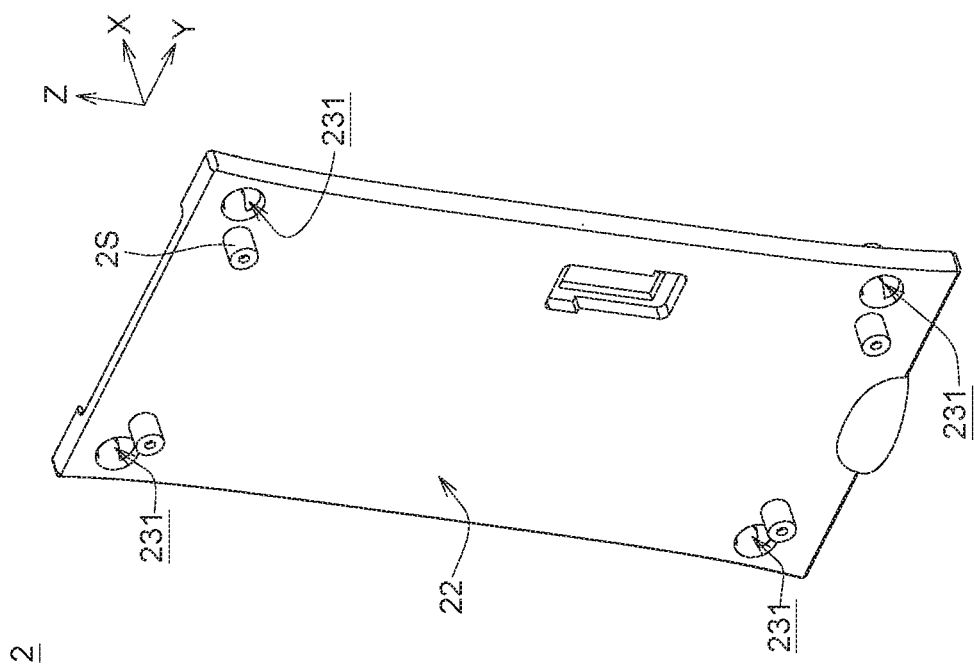
FIG. 3B is a three-dimensional diagram of the second plate viewed from bottom angle according to one embodiment of the present invention.
Figure 3A:
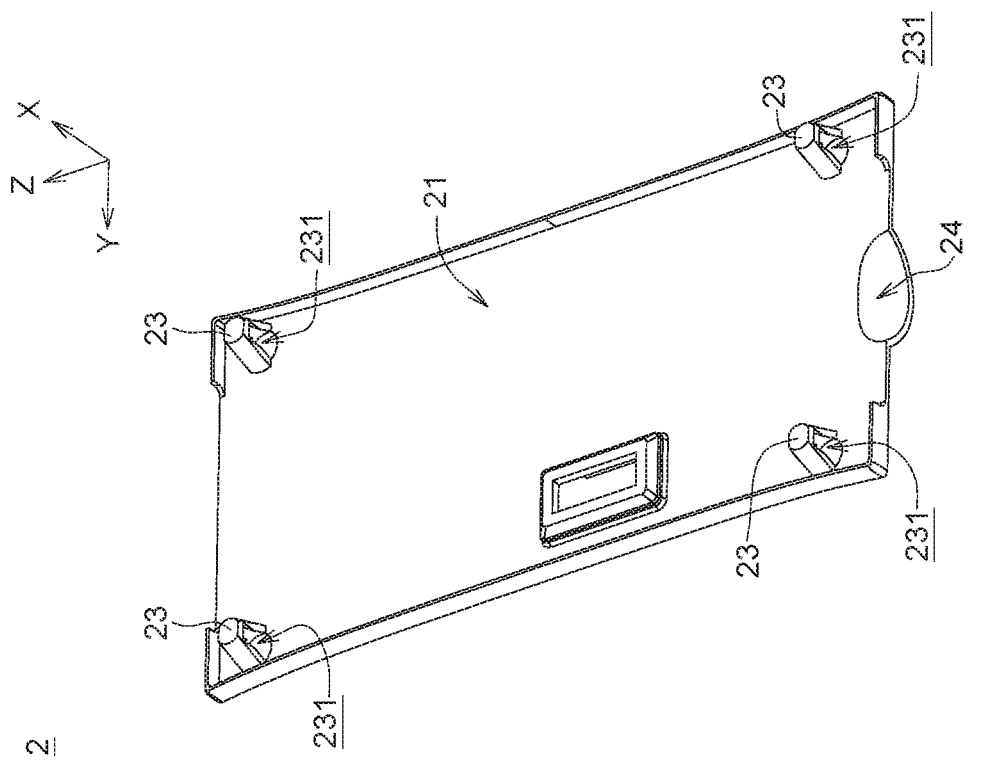
FIG. 3A is a three-dimensional diagram of the second plate viewed from top angle according to one embodiment of the present invention.

FIG. 3A and FIG. 3B are three-dimensional diagrams of the second plate 2 respectively viewed from two different angles according to one embodiment of the present invention. The second plate 2 includes the first surface 21 and the second surface 22 opposite to each other, wherein the first surface 21 faces the positive X axis, and the second surface 22 faces the negative X axis. The second plate 2 includes a plurality of second arches 23 projecting from the first surface 21 of the second plate 2. The second arches 23 correspond to the first arches 13 of the first plate 1. For example, the positions and quantity of the second arches 23 correspond to those of the first arches 13 of the first plate 1.

Each of the second arches 23 has a latching hole 231. Referring to FIG. 3A, the latching hole 231 passes beneath each second arch 23 in an axial direction parallel to Z axis. In addition, referring to FIG. 3B, in one embodiment, the latching hole 231 is further recessed from the second surface 22 of the second plate 2 in a direction towards the positive X axis, but does not pass through each second arch 23 in a direction towards the positive X axis.

Referring to FIG. 2A, FIG. 2B and FIG. 3A, when the first surface 21 of the second plate 2 is attached to the second surface 12 of the first plate 1, the alignment holes 131 of the first arches 13 of the first plate 1 accommodate the second arches 23 of the second plate 2, respectively. In other words, the top portions of the second arches 23 partially occupy the space of the alignment holes 131, respectively.

Figure 4:
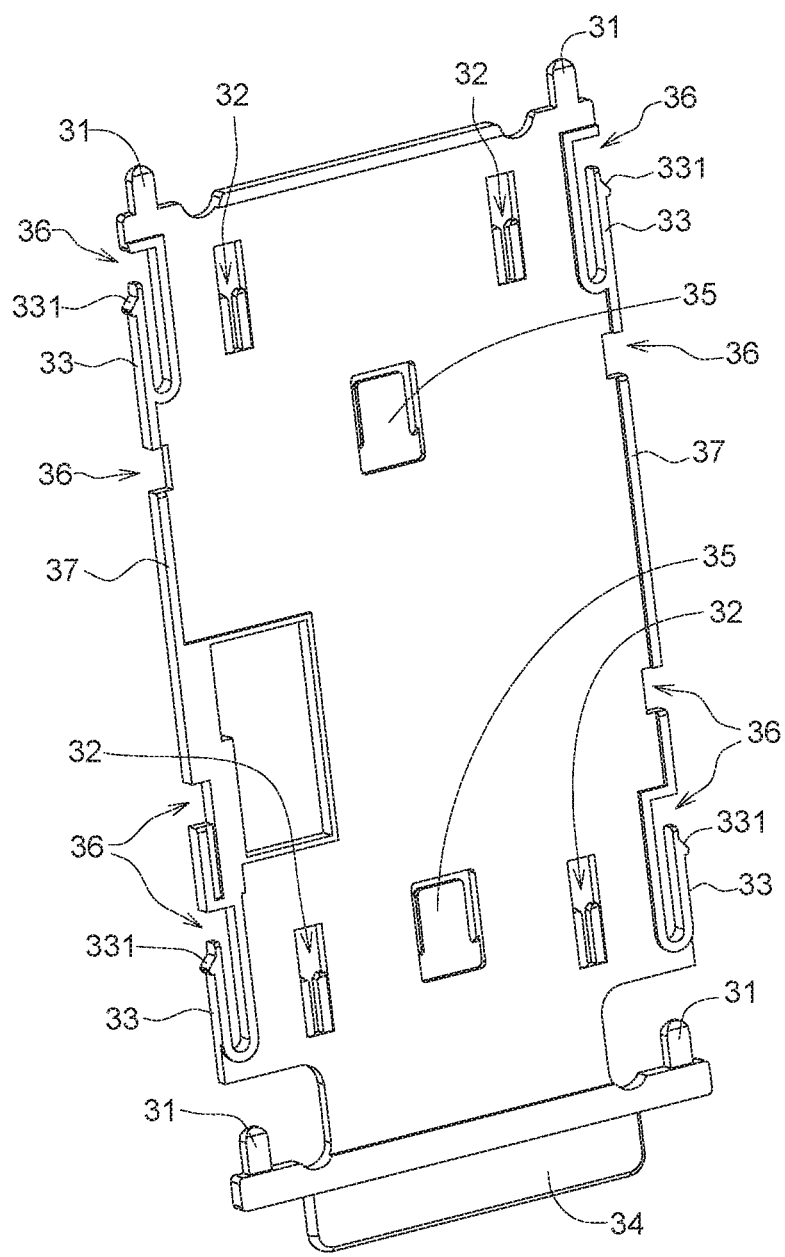
FIG. 4 is a three-dimensional diagram of the sliding plate according to one embodiment of the present invention.

FIG. 4 is a three-dimensional diagram of the sliding plate 3 according to one embodiment of the present invention. Referring to FIG. 4, the sliding plate 3 includes a plurality of pins 31, and each pin 31 extends in Z axis. The pins 31 correspond to the alignment holes 131 of the first arches 13 of the first plate 1 and the latching holes 231 of the second arches 23 of the second plate 2. For example, the positions and quantity of the pins 31 correspond to those of the alignment holes 131 of the first arches 13 of the first plate 1 and those of the latching holes 231 of the second arches 23 of the second plate 2.

Referring to FIG. 2A, FIG. 2B, FIG. 3A, FIG. 3B and FIG. 4, the sliding plate 3 is firstly disposed on the first surface 11 of the first plate 1, and on the first surface 11, the sliding plate 3 is movable between a latching position and a retracted position in Z axis. When the sliding plate 3 is located at the latching position, the pins 31 are each located in a corresponding one of the alignment holes 131 of the first arches 13 of the first plate 1. When the sliding plate 3 is located at the retracted position, the pins 31 each separates from the corresponding one of the alignment holes 131. In a condition when the sliding plate 3 is located at the retracted position, the second arches 23 are allowed to enter the alignment holes 131 in a direction towards the positive X axis, or separate from the alignment holes 131 in a direction towards the negative X axis. When the alignment hole 131 of each first arch 13 of the first plate 1 accommodates each of the second arches 23 of the second plate 2, the sliding plate 3 may move in the positive Z axis to the latching position, such that the pins 31 are each located in a corresponding one of the latching holes 231 of the second arches 23 of the second plate 2. Accordingly, the pins 31 may block separation of the first plate 1 from the second plate 2 in X axis.

In one embodiment, the first plate 1 may has a recessed positioning portion 14 recessed form the first surface 11 of the first plate 1 in the negative X axis. The recessed positioning portion 14 includes a first recess portion 141 and a second recess portion 142. In addition, the sliding plate 3 may include an elastic positioning portion 35. When the sliding plate 3 is located at the retracted position, the elastic positioning portion 35 may be fit into the first recess portion 141. Thus, the sliding plate 3 cannot easily have relative motion with respect to the first plate 1 in the Z axis. While the sliding plate 3 moves from the retracted position to the latching portion in the positive Z axis, the elastic positioning portion 35 may be detached from the first recess portion 141. When the sliding plate 3 is located at the latching position, the elastic positioning portion 35 may be fit into the second recess portion 142. Thus, the sliding plate 3 cannot easily have relative motion with respect to the first plate 1 in the Z axis.

Furthermore, the engagement of the first recess portion 141 and the elastic positioning portion 35 or the engagement of the second recess portion 142 and the elastic positioning portion 35 may further enhance user's hand feelings during operation. In other words, when the elastic positioning portion 35 is fit into the first recess portion 141, the user may be aware that the sliding plate 3 is at the retracted position. When the elastic positioning portion 35 is fit into the second recess portion 142, the user may be aware that the sliding plate 3 is at the latching position.

Figure 5A:
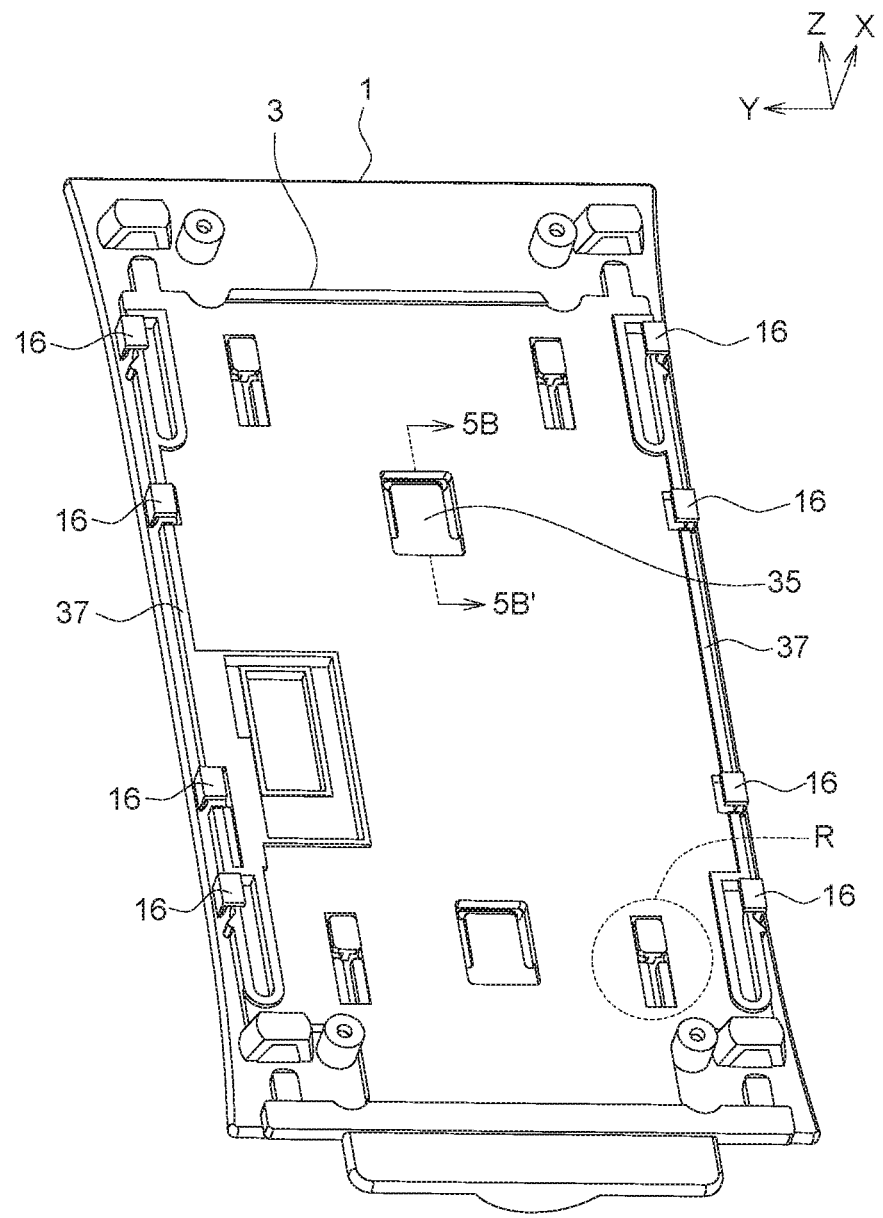
FIG. 5A is a schematic view showing that the sliding plate is assembled to the first plate.

FIG. 5A is a schematic view showing that the sliding plate 3 is assembled to the first plate 1. Referring to FIG. 2A, FIG. 2B, FIG. 4 and FIG. 5, the first plate 1 may further include a plurality of restraining portions 16 disposed on two opposite sides of the first plate 1 and projecting from the first surface 11. The restraining portions 16 are configured to restrict the sliding plate 3 to moving in Z axis and blocking separation of the sliding plate 3 from the first plate 1 in X axis. In one embodiment, the restraining portion 16 may be formed of L shape. Correspondingly, the sliding plate 3 may have a plurality of concave portions 36 recessed inwardly from two opposite side portions 37 of the sliding plate 3 and corresponding to the restraining portions 16 of the first plate 1. For example, the positions and quantity of the concave portions 36 correspond to those of the restraining portions 16 of the first plate 1. By the design of the corresponding restraining portions 16 and the concave portions 36, when the sliding plate 3 moves close to the first surface 11 of the first plate 1 in the negative X axis, the restraining portion 16 may pass through a corresponding one of the concave portions 36, such that the sliding plate 3 may disposed on the first surface 11 of the first plate 1 with no interference.

Figure 5B:
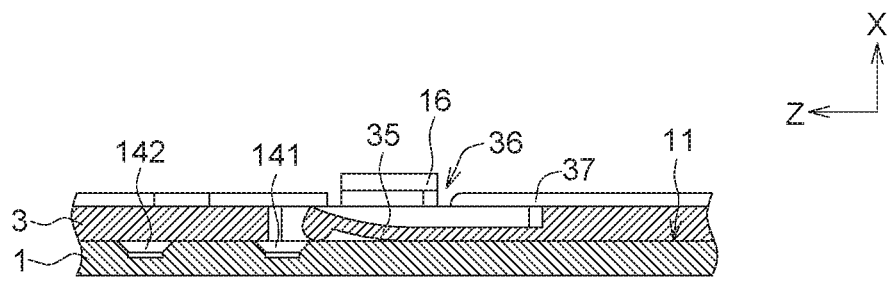
FIG. 5B is a cross-sectional view of FIG. 5A along line 5B-5B'.

Referring to FIG. 5B, a cross-sectional view of FIG. 5A along line 5B-5B' is illustrated. The restraining portion 16 of the first plate 1 passes through the corresponding concave portion 36. At this moment, the elastic positioning portion 35 abuts against the first surface 11 of the first plate 1, and is not fit into the first recess portion 141 yet.

Figure 6A:
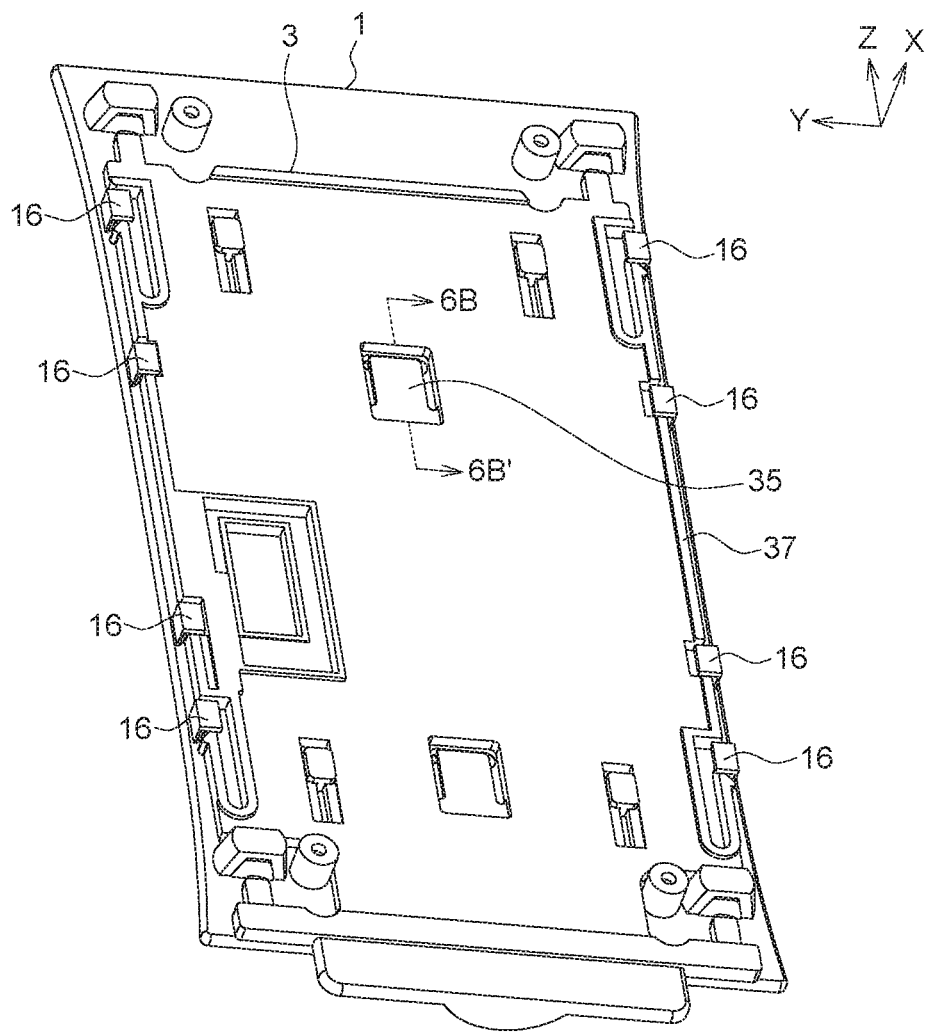
FIG. 6A is a schematic view showing that the sliding plate is located at the retracted position.
Figure 6B:
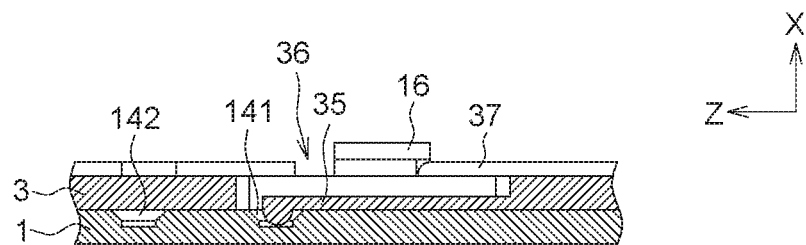
FIG. 6B is a cross-sectional view of FIG. 6A along line 6B-6B'.

Next, the sliding plate 3 is moved to the retracted position in the positive Z axis. FIG. 6A is a schematic view showing that the sliding plate 3 is located at the retracted position. FIG. 6B is a cross-sectional view of FIG. 6A along line 6B-6B'. Referring to FIG. 6A and FIG. 6B, when the sliding plate 3 is located at the retracted position, the elastic positioning portion 35 is fit into the first recess portion 141. In this condition, the sliding plate 3 would not move in Z axis if there is no sufficient force applied to the sliding plate 3 to detach the elastic positioning portion 35 from the first recess portion 141. In addition, the restraining portion 16 of the first plate 1 deviated from the corresponding concave portion 36 of the sliding plate 3, such that the side portion 37 of the sliding plate 3 enters a space formed by the L-shaped region of the restraining portion 16, preventing the sliding plate 3 from separating form the first plate 1 in the positive X axis. Hence, the step of disposing the sliding plate 3 on the first surface 11 of the first plate 1 is completed.

Figure 7A:
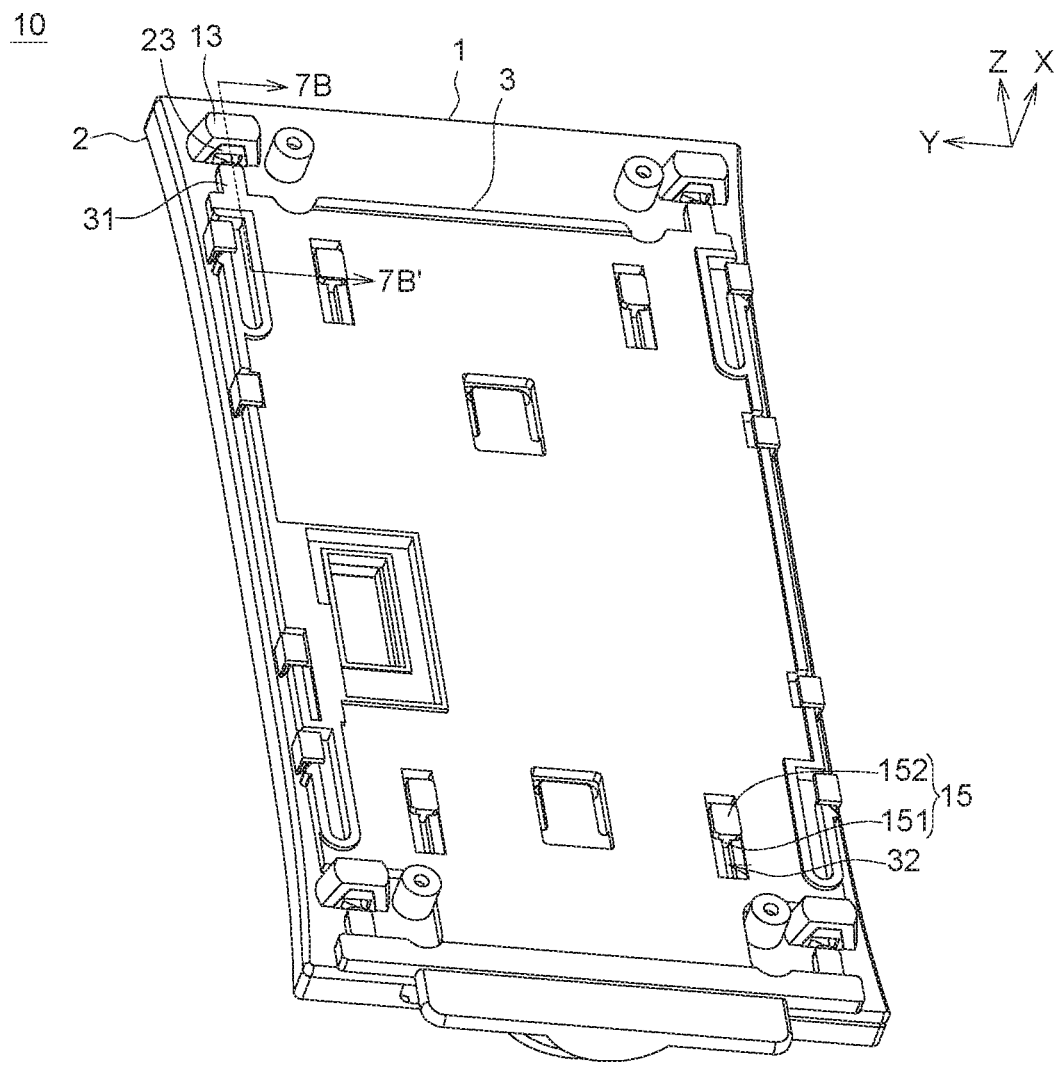
FIG. 7A is a schematic view showing that the second plate is assembled to the first plate of FIG. 6A.
Figure 7B:
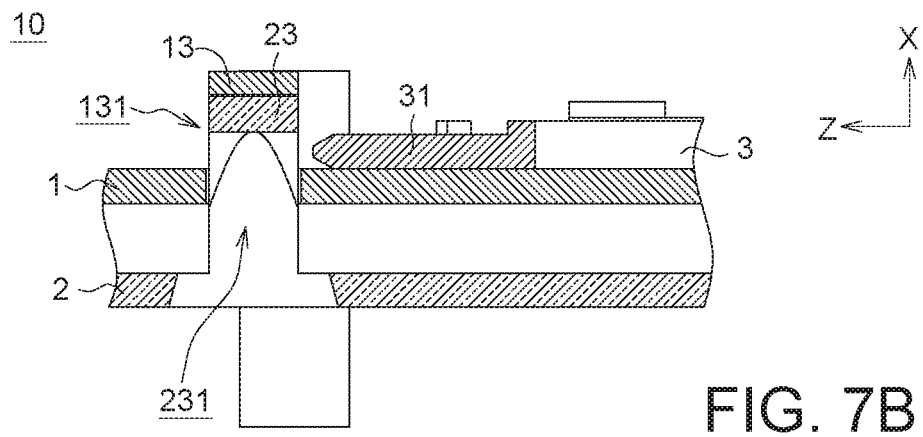
FIG. 7B is a cross-sectional view of FIG. 7A along line 7B-76'.

FIG. 7A is a schematic view showing that the second plate 2 is assembled to the first plate 1 of FIG. 6A. FIG. 7B is a cross-sectional view of FIG. 7A along line 7B-7B'. Referring to FIG. 7A and FIG. 7B, next, in a condition that the sliding plate 3 is located at the retracted position, the second plate 2 is moved close to the first plate 1 by facing the first surface 21 of the second plate 2 to the second surface 12 of the first plate 1, and each of the alignment holes 131 of the first arches 13 of the first plate 1 accommodates each of the second arches 23 of the second plate 2. Since each of the pins 31 has not entered the corresponding one of the latching holes 231 of the second arches 23, the first plate 1 may separate from the second plate 2 in X axis.

Figure 8A:
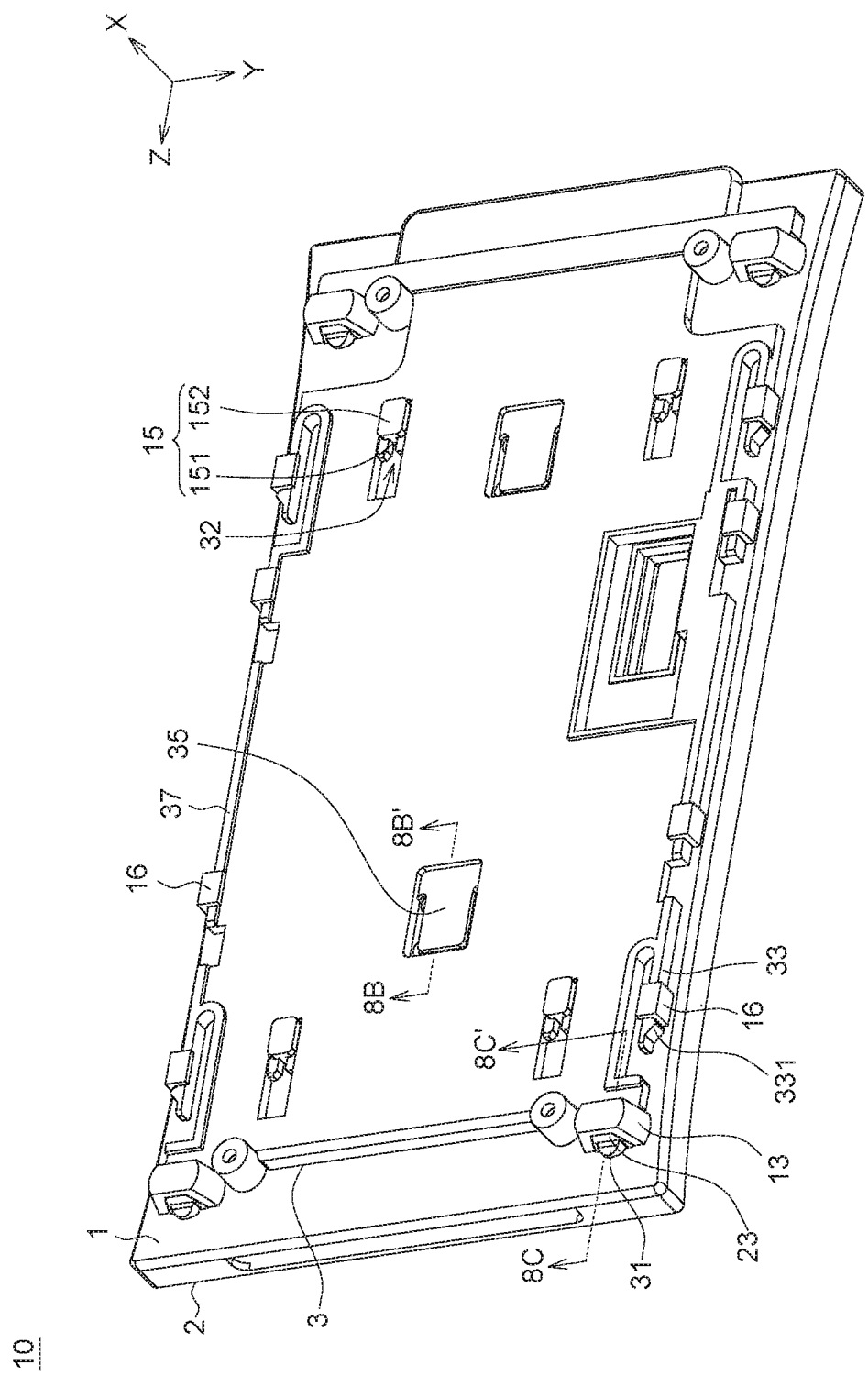
FIG. 8A is a schematic view showing that the sliding plate is located at the latching position.
Figure 8B:
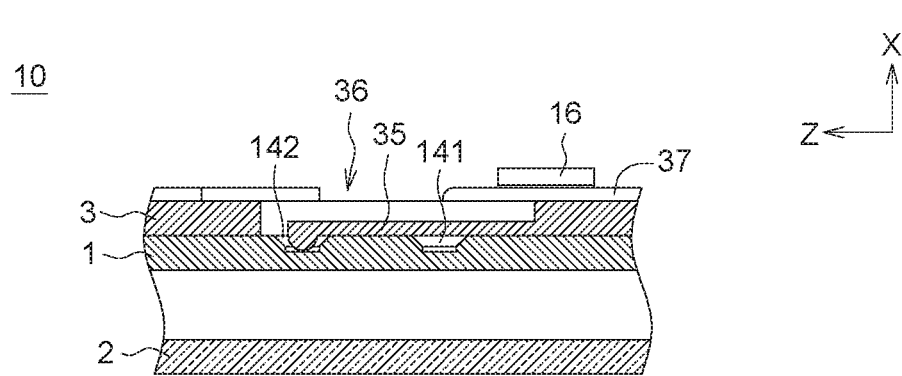
FIG. 8B is a cross-sectional view of FIG. 8A along line 8B-8B'.
Figure 8C:
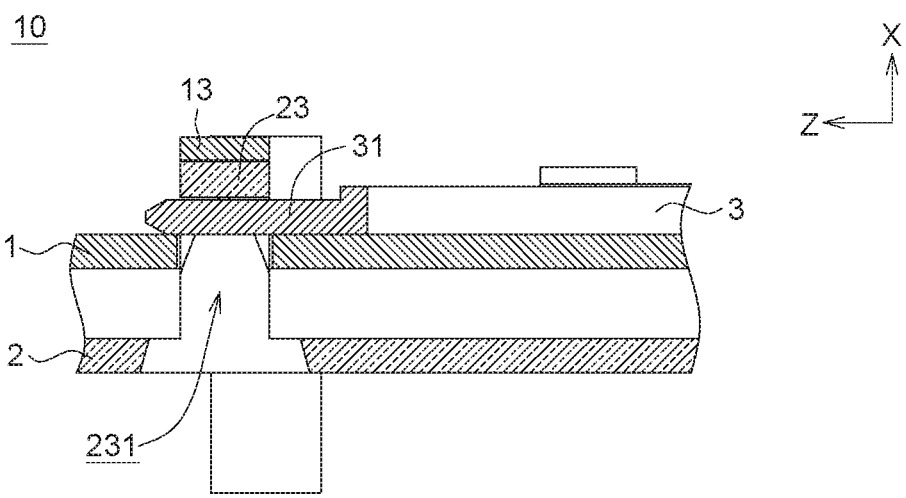
FIG. 8C is a cross-sectional view of FIG. 8A along line 8C-8C'.

Next, the sliding plate 3 is moved to the latching position in the positive Z axis. FIG. 8A is a schematic view showing that the sliding plate 3 is located at the latching position. FIG. 8B is a cross-sectional view of FIG. 8A along line 8B-8B'. FIG. 8C is a cross-sectional view of FIG. 8A along line 8C-8C'. Referring to FIG. 8A and FIG. 8B, when the sliding plate 3 is located at the latching position, the elastic positioning portion 35 is fit into the second recess portion 142. In addition, while the sliding plate 3 is moving to the latching position from the retracted position in the positive Z axis, each of the side portions 37 of the sliding plate 3 remains in the space formed by the L-shaped region of the restraining portion 16. Thus, during the time that the sliding plate 3 moves between the retracted position and the latching position, the sliding plate 3 cannot easily separate from the first plate 1 in the positive X axis.

Referring to FIG. 8A and FIG. 8C, when the sliding plate 3 is located at the latching position, the pins 31 are each located in a corresponding one of the latching holes 231 of the second arches 23. Thus, the pins 31 may block separation of the first plate 1 from the second plate 2 in X axis.

In one embodiment, when the sliding plate 3 is located at the latching position, each pin 31 further extends through and is projected from each latching hole 231 in Z axis. In other words, each of the pins 31 are longer than each of the latching holes 231 in Z axis. Thus, the pins 31 may securely block separation of the first plate 1 from the second plate 2 in X axis, preventing the pins 31 from being detached from the latching holes 231 due to deformation.

In one embodiment, the sliding plate 3 may further include a plurality of elastic arms 33 disposed on two opposite sides of the sliding plate 3 and corresponding to some of the restraining portions 16 of the first plate 1. Each of the elastic arms 33 comprises a hook 331. As shown in FIG. 8A, when the sliding plate 3 is located at the latching position, the hook 331 is coupled with a corresponding one of the restraining portions 16, such that the sliding plate 3 is securely located at the latching position. Thus, the sliding plate 3 would not move in the negative Z axis if there is no sufficient force applied to the sliding plate 3 in the negative Z axis to detach the hook 331 from the restraining portion 16.

Figure 5C:
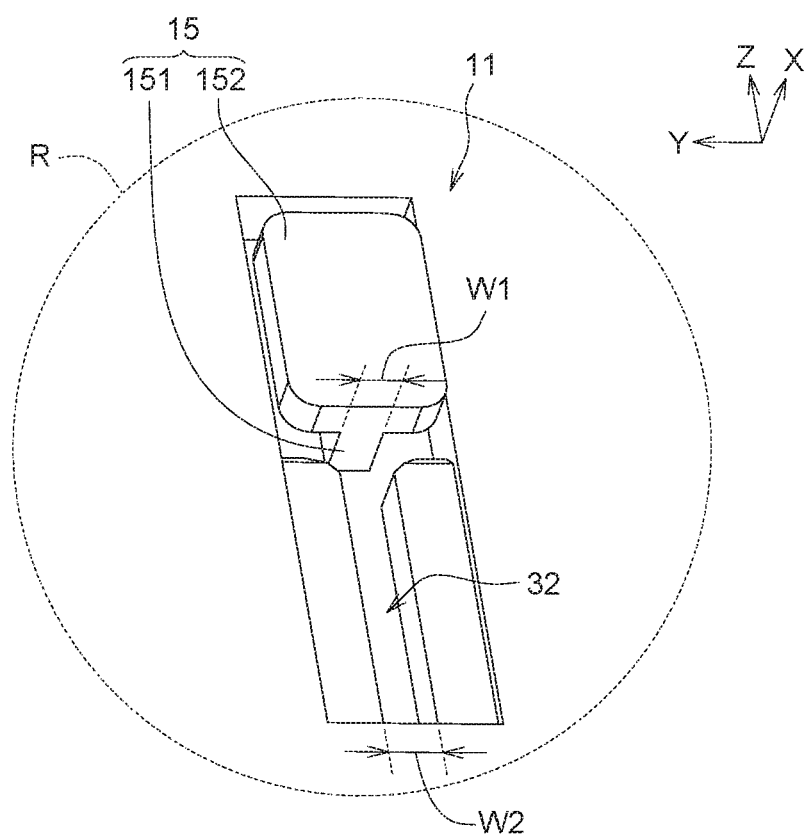
FIG. 5C is an enlarged view of a region R in FIG. 5A.

On the other hand, to enhance user's hand feelings during operation, and further assist in restricting the sliding plate 3 to moving in Z axis, the first plate 1 and the sliding plate 3 may respectively include a positioning rib 15 and a positioning groove 32. Referring to FIG. 5C, the positioning rib 15 may be formed of T shape, and include a vertical portion 151 disposed perpendicular to the first surface 11 and a horizontal portion 152 disposed parallel to the first surface 11. The positioning groove 32 extends in Z axis. The vertical portion 151 has a width W1, and the positioning groove 32 has a width W2. The width W2 may be approximately equal to the width W1, and therefore the vertical portion 151 of the positioning rib 15 may move inside of the positioning groove 32. As shown in FIG. 7A and FIG. 8A, when the sliding plate 3 moves between the latching position and the retracted position in Z axis, the positioning rib 15 abuts against the positioning groove 32. More specifically, both of the vertical portion 151 and the horizontal portion 152 of the positioning rib 15 abut against the positioning groove 32. The frictional force resulting from the contact of the positioning rib 15 and the positioning groove 32 may enhance user's hand feelings during operation. Furthermore, when the sliding plate 3 moves between the latching position and the retracted position in Z axis, the vertical portion 151 is restricted to moving inside of the positioning groove 32. The horizontal portion 152 may prevent the sliding plate 3 from separating from the first plate 1 in the positive X axis, and the sliding plate 3 is therefore restricted to moving in Z axis. The positioning rib 15 and the positioning groove 32 of the present invention are not limited to the above configurations.

Through the above configurations, the first plate 1 and the sliding plate 3 are assembled first, as shown in FIG. 5A and FIG. 6A, such that on the first surface 11 of the first plate 1, the sliding plate 3 is movable between the latching position and the retracted position in Z axis. Next, as shown in FIG. 1A, FIG. 2A and FIG. 2B, the first plate 1 may have a plurality of screw holes 1S for a plurality of screwing members passing through to fasten the first plate 1 on the first communication device 101. Thus, the second surface 12 of the first plate 1 is used as an appearance surface of the first communication device 101, and the sliding plate 3 is disposed on the first surface 11 used as the inner surface. In addition, as shown in FIG. 1A, FIG. 3A and FIG. 3B, the second plate 2 may have a plurality of screw holes 2S for a plurality of screwing members passing through to fasten the second plate 2 on the second communication device 102. Thus, the first surface 21 of the second plate 2 is used as an appearance surface of the second communication device 102. Hence, at the time of shipment, the latching structure 10 may be respectively disposed on two modular products, which can be assembled with each other. After the steps described with reference to FIG. 7A and FIG. 8A, the combination of the first communication device 101 and the second communication device 102 is very simple, convenient and reliable.

Moreover, referring to FIG. 1A and FIG. 4, the sliding plate 3 may include a pinch portion 34 for the user to move sliding plate 3 with fingers. The pinch portion 34 is disposed adjacent to a bottom portion 101b of the first communication device 101. The bottom portion 101b of the communication device 101 may, for example, be a base, a bottom plate or any structure that can be a stand for supporting the first communication device 101 on a plane. When the sliding plate 3 is located at the latching position, the pinch portion 34 does not project from the bottom portion 101b of the first communication device 101. When the sliding plate 3 is located at the retracted position, the pinch portion 34 may project out from the bottom portion 101b of the first communication device 101. In this condition, the first communication device 101 cannot firmly stand on the plane, such that the user may be aware that the sliding plate 3 is not located at the exact position. The user may then move the sliding plate 2 to the latching position, so that the first communication device 101 may stand on the plane.

Furthermore, referring to FIG. 1A and FIG. 3A, the second plate 2 may have a pinch space 24 disposed corresponding to the pinch portion 34. That is, the pinch space 24 is disposed adjacent to a bottom portion 102b of the second communication device 102. The bottom portion 102b of the second communication device 102 may, for example, be a base, a bottom plate or any structure that can be a stand for supporting the second communication device 102 on a plane. In a condition that the first communication device 101 and the second communication device 102 are combined with each other, the pinch space 24 may allow the user to pinch the pinch portion 34 with fingers.

At the time of shipment, the easily assembled and disassembled latching structure provided above may be respectively disposed on the two modular products, which can be assembled with each other, and the combination of the two modular products is very simple, convenient and reliable.

It will be apparent to those skilled in the art that various modifications and variations can be made to the disclosed embodiments. It is intended that the specification and examples be considered as exemplary only, with a true scope of the invention being indicated by the following claims and their equivalents.

What is claimed is:

1. A latching structure comprising:
   a first plate comprising a plurality of first arches projecting from a first surface of the first plate and recessed from a second surface of the first plate, the first arches each having an alignment hole passing underneath each of the first arches in a first axial direction, wherein the first surface is opposite to the second surface;
   a second plate comprising a plurality of second arches each having a latching hole, wherein each of the second arches is adapted to be accommodated by a corresponding one of the alignment holes, and each of the latching holes passes underneath each of the second arches in the first axial direction; and
   a sliding plate comprising a plurality of pins respectively corresponding to the latching holes, the sliding plate disposed on the first surface of the first plate and movable between a latching position and a retracted position in the first axial direction;

wherein when each of the alignment holes accommodates a corresponding one of the second arches and the sliding plate is located at the latching position, the pins are each located in a corresponding one of the latching holes to block separation of the first plate from the second plate in a second axial direction perpendicular to the first axial direction;

when the sliding plate is located at the retracted position, the pins each separates from the corresponding one of the latching holes to allow separation of the first plate from the second plate in the second axial direction.

2. The latching structure according to claim 1, wherein each of the pins are longer than each of the latching holes.

3. The latching structure according to claim 1, wherein the first plate is a side plate of a communication device; the sliding plate comprises a pinch portion disposed adjacent to a bottom portion of the communication device, and when the sliding plate is located at the retracted position, the pinch portion projects out from the bottom portion of the communication device.

4. The latching structure according to claim 3, wherein the second plate has a pinch space disposed corresponding to the pinch portion.

5. The latching structure according to claim 1, wherein the first arches are disposed on four corners of the first plate.

6. The latching structure according to claim 1, wherein the first plate has a first recess portion and a second recess portion, the sliding plate further comprises an elastic positioning portion;

when the sliding plate is located at the retracted position, the elastic positioning portion is fit into the first recess portion;

when the sliding plate is located at the latching position, the elastic positioning portion is fit into the second recess portion.

7. The latching structure according to claim 1, wherein the first plate and the sliding plate respectively comprise a positioning rib and a positioning groove;

when the sliding plate moves between the latching position and the retracted position in the first axial direction, the positioning rib abuts against the positioning groove.

8. The latching structure according to claim 7, wherein the positioning rib and the positioning groove are configured to block separation of the sliding plate from the first plate in the second axial direction when the sliding plate moves between the latching position and the retracted position in the first axial direction.

9. The latching structure according to claim 1, wherein the first plate further comprises a plurality of restraining portions disposed on two opposite sides of the first plate and projecting from the first surface, and the restraining portions are configured to restrict the sliding plate to moving in the first axial direction and blocking separation of the sliding plate from the first plate in the second axial direction when the sliding plate is located at the retracted position.

10. The latching structure according to claim 9, wherein the sliding plate further comprises a plurality of elastic arms disposed on two opposite sides of the sliding plate and corresponding to parts of the restraining portions, the elastic arms each comprises a hook, and when the sliding plate is located at the latching position, the hook is coupled with a corresponding one of the restraining portions.

* * * * *